(12) United States Patent
Cutler (10) Patent No.: US 7,799,988 B2
(45) Date of Patent: Sep. 21, 2010

(54) APPARATUS AND SYSTEM FOR A SINGLE ELEMENT SOLAR CELL

(76) Inventor: Paul H. Cutler, 232 Woodland Dr., State College, PA (US) 16803

( * ) Notice: Subject to any disclaimer, the term of this patent is extended or adjusted under 35 U.S.C. 154(b) by 0 days.

(21) Appl. No.: 12/157,842

(22) Filed: Jun. 13, 2008

(65) Prior Publication Data

US 2009/0308443 A1 Dec. 17, 2009

(51) Int. Cl.
*H01L 31/00* (2006.01)
(52) U.S. Cl. .................. 136/255; 136/252; 136/256
(58) Field of Classification Search .......... 136/252–265
See application file for complete search history.

(56) References Cited

U.S. PATENT DOCUMENTS

| | | |
|---|---|---|
| 2002/0150524 A1 | 10/2002 | Smalley et al. |
| 2003/0127641 A1 | 7/2003 | Eliasson et al. |
| 2005/0253137 A1 | 11/2005 | Whang et al. |
| 2007/0240757 A1 | 10/2007 | Ren et al. |

FOREIGN PATENT DOCUMENTS

WO 2008/060640 5/2008

OTHER PUBLICATIONS

"Advanced antenna theory," New York: John Wiley & Sons, 1952. (Table of Contents only).

Burke, P., et al., "Quantitative Theory of Nanowire and Nanotube Antenna Performance," 5 IEEE Trans. on Nanotech. 314 (2006).
Burke, P., "Luttinger Liquid Theory as a Model of the Gigahertz Electrical Properties of Carbon Nanotubes," 1 IEEE Trans. on Nanotech. 129 (2002).
Carver, K.R. and Mink, J.W., "Microstrip Antenna Technology," IEEE Trans. Antennas and Propogation, AP-29, No. 1, 2 (1981).
Green, S.J., "Point Contact MOM Tunneling Detector Analysis," 142 Appl. Phys. 1166 (1971).
Kempa, K., et al., "Carbon Nanotubes as Optical Antennae," Adv. Mater. 19, 421-426 (2007).
Mayer, A., et al., "Three-Dimensional Analysis of the Geometrical Rectifying Properties of Metal-Vacuum-Metal Junctions and Extension for Energy Conversion," Phys. Rev. B. 77, 085411 (Feb. 8, 2008).
Nguyen, H.Q., "Experimental and Theoretical Studies of Tunneling Phenomena Using Scanning Tunneling Microscopy and Spectroscopy," Ph. D. Thesis, available from University Microfilms International, now called Bell and Howell Information and Learning (1989).
Nguyen H.Q., et al., "Mechanisms of Current Rectification in an STM Tunnel Junction and the Measurement of an Operational Tunneling Time," IEEE Trans. on Electron Devices, 36, pp. 2671-2678, (1989).

(Continued)

*Primary Examiner*—Jeffrey T Barton
(74) *Attorney, Agent, or Firm*—Kenyon & Kenyon LLP (57) ABSTRACT

A device for receiving and converting incident radiation into DC current, the device including a transparent conductor, at least one point-contact diode, the at least one point-contact diode having a nanowire/mCNT providing a receiving antenna function and a rectification function, a thin insulating layer situated between the transparent conductor and the nanowire/mCNT, and a point contact junction at which the nanowire/mCNT contacts the thin insulating layer.

30 Claims, 8 Drawing Sheets

OTHER PUBLICATIONS

Reference Report of the Basic Energy Sciences Workshop on Solar Energy Utilization, Basic Research Needs for Solar Energy Utilization, Sponsored by the Office of Science, U.S. Department of Energy, Apr. 18-21, Bethesda, Maryland.

Sullivan, T.E., et al., "The Use of Antenna Theory to Calculate the Electric Fields in a Thermal Field Emission Metal Whisker Diode," Surface Sci. 62, 455 (1977).

Sullivan, T.E., "Thermal and Field Emission Effects of Laser Radiation on Meal Whisker Diodes: Application to Infrared Detection Devices," Ph.D. Thesis, University Microfilms International (now called Bell and Howell Information and Learning) (1977).

Bernstein et al., "*Biologically-Inspired Cellular Machine Architectures*," in: "*Managing Nano-Bio-Info-Cogno Innovations: Converging Technologies Society*" [online], edited by Bainbridge et al., 2005, retrieved from the Internet: <URL: http://www.wtec.org/ConvergingTechnologies/3/NBIC3_report.pdf> Article 10, pp. 133-151.

B. Berland, *Photovoltaic Technologies Beyond the Horizon: Optical Rectenna Solar Cell*, Final Report [online], National Renewable Energy Laboratory, Feb. 2003, retrieved from the Internet: <URL: http://www.nrel.gov/docs/fy03osti/33263.pdf>.

International Search Report dated Oct. 30, 2009, issued in corresponding International Application No. PCT/US2009/047209.

Written Opinion dated Oct. 30, 2009, issued in corresponding International Application No. PCT/US2009/047209.

J. Mologni, et al., "*Numerical study on performance of pyramidal and conical isotropic etched single emitters*," Microelectronics Journal 37: 152-157 (2006).

D. Resnik, et al., "*Different aspect ratio pyramidal tips obtained by wet etching of (100) and (111) silicon*," Microelectronics Journal 34: 591-593 (2003).

Point Contact Diode, Fast Neutron Research Facility Ion Beam Technology Center, www.fnrf.science.cmu.ac.th/theory/microwave/Microwave%2014a.html, 6 pages.

J. Hafner, et al., "*Growth on nanotubes for probe microscopy tips*," Nature 398: 761-762 (1999).

J. Martinez, et al., "*Length control and sharpening of atomic force microscope carbon nanotube tips assisted by an electron beam*," Nanotechnology 16: 2493-2496 (2005).

APPARATUS AND SYSTEM FOR A SINGLE ELEMENT SOLAR CELL

FIELD OF THE INVENTION

The present invention relates to a solar cell device for receiving and converting incident radiation into DC current.

BACKGROUND INFORMATION

Solar energy is an abundant renewable energy source. It has been estimated that the sun deposits more than 12,000 terrawatts (TW) of energy on Earth, which is large compared to the 13 TW of total current power consumption worldwide. Thus, converting even 0.1% of the sunlight into useful electricity could eventually meet the total current power consumption worldwide.

There are various ways to capture, store and convert solar radiation in useful forms of energy. Solar cells are one way to directly convert sunlight into electricity. Various materials and technologies have been developed that involve single crystal, polycrystalline, amorphous and nanostructured inorganic and organic materials for use in solar cells. More recently, multi-junction cells, quantum dots and dye sensitized photovoltaics have received attention within the solar cell community. However, these solar cells are generally considered to have relatively low conversion efficiencies. Solar cells made from Gallium Arsenide (GaAs) materials show efficiencies about as high as 25-30%, although some laboratory devices have reported efficiencies of up to 40% or more, as in the Reference Report of the Basic Energy Sciences Workshop on Solar Energy Utilization, Basic Research Needs for Solar Energy Utilization, Sponsored by the Office of Science, U.S. Department of Energy, April 18-21, Bethesda, Md.

Simply stated, a solar cell includes an "antenna" which captures (or absorbs) the solar radiation and a rectifying element which converts the captured wave (photon) into a direct current (DC) output.

For semiconductor based photovoltaic solar cells, the DC power output is highly material dependent (e.g., bandgap and resistivity) and there is a maximum theoretical efficiency (of about 41%) to capture and convert solar energy. This theoretical limit of the solar cell results because (i) the incident light with energy less than the bandgap can not be absorbed; and (ii) for all the incident light with energy equal to or larger than the bandgap, only the energy equal to the bandgap can be efficiently converted into a useful DC current. While it may be possible to increase the maximum obtainable efficiency by using multi-junction solar cells, this requires increased complexity and cost.

Thus, there is a need for an improved solar-to-electric conversion device having higher conversion efficiencies that are commercially viable. In particular, there is a need for solar energy conversion devices in which the maximum theoretical collection efficiency does not depend on the bandgap energy of the collector in the solar cell or equivalently of the incident photon energy or wavelength.

A rectenna (rectifying antenna) is a device which includes a receiving antenna and a rectifying diode. Rectennas have been investigated in the microwave region for power transmission and detection. Applications have included long distance power beaming, signal detection and wireless control systems. Within the microwave region, it is believed that the greatest conversion efficiency may have been achieved by a rectenna element in 1977 by Brown, Raytheon Company. Using a GaAs—Pt Schottky barrier diode, a 90.6% conversion efficiency was recorded with an input microwave-power level of 8 Watts. However, conversion efficiencies in the range of about 80% are believed to be more representative.

It has been suggested that the rectenna concept is arbitrarily scaleable. That is, the optical rectenna is a direct extension to shorter wavelengths. Some recent work with such rectennas in the area has been performed by ITN Energy Systems under DOE and DARPA sponsorship. ITN Energy Systems assertedly demonstrated that such micro-scale and nano-scale rectenna devices can convert simulated solar radiation to DC electric power. ITN Energy Systems has asserted that the rectenna devices using improved metal-insulator-metal (MIM) diodes may be expected "to yield much higher efficiencies (>85%)." Even though there are no confirmed experimental results with these efficiencies, by extrapolation from the microwave region, ITN estimates that for devices operating in the solar spectrum region, there exists the potential to convert over 85% of the sun's energy to useable power compared to the 10-30% that is presently achievable with standard semiconductor based photovoltaics, such as GaAs.

It is believed, however, that useful power conversion in the optical frequency range may be limited by the low frequency response of the planar diodes employed in the foregoing studies (in particular, the diodes were 100 nanometer square in the ITN device). Prior efforts to develop solar cells using standard two-element rectennas are believed to have had limited success due to the frequency limited response of the planar MIM diodes.

It is believed that the problem of frequency response of the planar MIM diodes (which are limited by parasitic capacitance effects) may be overcome by using point-contact nanowires or metallic carbon nanotubes (mCNTs), each acting as an antenna and a rectifier. Point-contact devices (for example, whisker diodes) have been used to measure absolute laser frequencies up to the green part of the visible spectrum, and have demonstrated a response time on the order of femtoseconds, which is orders of magnitude faster than conventional MIM diodes. A whisker is a metal wire with a sharp edge that is sub-micron in size.

Hung Quang Nguyen measured the frequency response of a laser irradiated STM junction by changing the spacing of the junction. The results show that beyond about 1-3 nanometers, the emitted current drops significantly, which indicates that fewer electrons are able to tunnel through the barrier due to the change in polarity of the oscillating electric field, as discussed by Hung Quang Nguyen in *Experimental and Theoretical Studies of Tunneling Phenomena Using Scanning Tunneling Microscopy and Spectroscopy*, Ph. D. Thesis, available from University Microfilms International, now called Bell and Howell Information and Learning (1989).

A three-dimensional quantum mechanical study of the properties of point-contact diode structures (for both mCNTs and nanowires) as a rectenna for application as a solar cell is discussed in the article by A. Mayer, M. S. Chung, B. L. Weiss, N. M. Miskovsky, and Paul H. Cutler, *Three-Dimensional Analysis of the Geometrical Rectifying Properties of Metal-Vacuum-Metal Junctions and Extension for Energy Conversion*, Phys. Rev. B. 77, 085411 (Feb. 8, 2008), which is incorporated by reference.

In the articles by Peter Burke, Shendong Li, and Zhen Yu, *Quantitative Theory of Nanowire and Nanotube Antenna Performance*, 5 IEEE Trans. on Nanotech. 314 (2006) and P. J. Burke, *A Luttinger Liquid Theory as a Model of the Gigahertz Electrical Properties of Carbon Nanotubes*, 1 IEEE Trans. on Nanotech. 129 (2002), the antenna properties of mCNTs were analyzed by modeling the electron gas as a Luttinger liquid (i.e., 1-D interacting electron gas). The nanowires/mCNTs were treated as 1-D conductors in antenna and transmission line configurations by classical antenna theory. The addition of two electrical and magnetic contributions were included in treating the nanowire/mCNT circuit elements. These are a quantum capacitance and a kinetic inductance, which is analogous to the classical magnetic inductance. In the Burke article, the multi-walled CNT was treated as an antenna (within classical antenna theory), but included these additional contributions as lumped circuit elements.

Mayer's quantum mechanical calculations include Burke's quantum mechanical corrections. In particular, the Mayer article discusses the determination of the static and dynamic tunneling barriers, for static and induced AC fields due to incident radiation for the 440 nanometer green line in the optical region. These calculations were done for similar and dissimilar combinations of metallic tips and bases (i.e., anode or planar electrodes). Temperature asymmetries between the tips and the bases were also included, and results were obtained as a function of tip radius and tip-anode separation. Calculated rectified currents were obtained leading to a DC voltage across an external load.

Properties of the currents and voltages developed in a whisker-type-nanowire antenna have been discussed by T. E. Sullivan, Paul H. Cutler, and A. A. Lucas in *The Use of Antenna Theory to Calculate the Electric Fields in a Thermal Field Emission Metal Whisker Diode*, Surface Sci. 62, 455 (1977) and by T. E. Sullivan in *Thermal and Field Emission Effects of Laser Radiation on Meal Whisker Diodes: Application to Infrared Detection Devices*, Ph.D. Thesis, University Microfilms International (now called Bell and Howell Information and Learning) (1977), which are incorporated by reference. The latter Sullivan article discusses the calculation of fields and voltages induced on different metal whisker tips by incident laser radiation, and the use of linear antenna theory to describe the receiving properties of the whiskers.

Planar and cylindrical antennas are known in the field of antenna theory, as discussed by Keith R. Carver and James W. Mink in *Microstrip Antenna Technology*, IEEE Trans. Antennas and Propogation, AP-29, No. 1, 2 (1981).

The actual pointed geometry of the tip is taken into account using Schelkunoff's theory of the bi-conical antenna, and is discussed, for example, in *Advanced antenna theory*, New York: John Wiley & Sons, 1952. The strength of the electric fields are found to be comparable to the strength necessary for field emission ($F \geqq 10^7$ V/cm). As discussed by T. E. Sullivan in *Thermal and Field Emission Effects of Laser Radiation on Meal Whisker Diodes: Application to Infrared Detection Devices*, Ph.D. Thesis, University Microfilms International (now called Bell and Howell Information and Learning) (1977), the highest fields are established on gold tips. This is consistent with the experiments of Green, who found that the best response occurs with gold-gold contacts, as discussed by S. J. Green in *Point Contact MOM Tunneling Detector Analysis*, 142 Appl. Phys. 1166 (1971). This theory predicts that the detection sensitivity is determined by the Schelkunoff's radiation reactance.

The article by A. Mayer, M. S. Chung, B. L. Weiss, N. M. Miskovsky, and Paul H. Cutler, *Three-Dimensional Analysis of the Geometrical Rectifying Properties of Metal-Vacuum-Metal Junctions and Extension for Energy Conversion*, Phys. Rev. B. 77, 085411 (Feb. 8, 2008), which is incorporated by reference, discusses performing a three-dimensional analysis of the geometrical rectifying properties of metal-vacuum-metal (MVM) junctions (and implicitly MIM junctions), in which the lower metal supports a hemi-spherical protrusion that simulates a tip. Because of this geometrical asymmetry, the system assertedly exhibits rectification properties that were examined by using a transfer-matrix methodology, which took into account three-dimensional aspects of the potential barrier. These results assertedly demonstrate that junctions presenting either a geometrical, a material or a thermal asymmetry exhibit rectification properties, which enable the production of DC currents from an oscillating field.

Figure 7A:
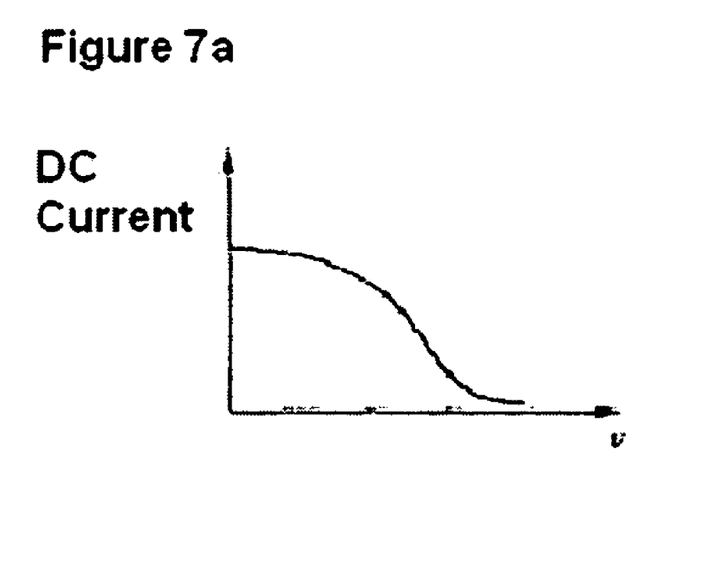
FIG. 7a shows experimental results of the measurement of DC output over an STM junction at a constant tip-anode spacing as a function of the frequency of incident radiation (as discussed in Hung Quang Nguyen, *Experimental and Theoretical Studies of Tunneling Phenomena Using Scanning Tunneling Microscopy and Spectroscopy*, Ph. D. Thesis, available from University Microfilms International, now called Bell and Howell Information and Learning (1989)).
Figure 7B:
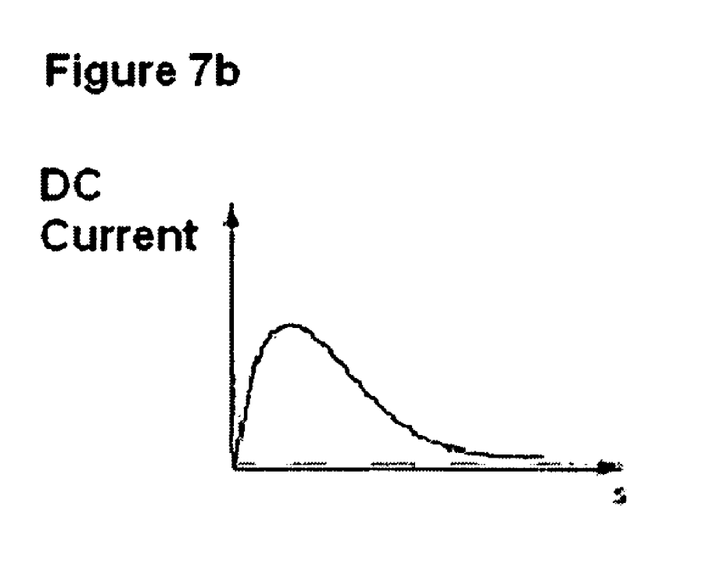
FIG. 7b shows experimental results of the measurement of DC output over an STM junction at a constant frequency of incident radiation as a function of the tip-anode spacing (as discussed in Hung Quang Nguyen, *Experimental and Theoretical Studies of Tunneling Phenomena Using Scanning Tunneling Microscopy and Spectroscopy*, Ph. D. Thesis, available from University Microfilms International, now called Bell and Howell Information and Learning (1989)).

FIGS. 7a and 7b show the trends in measured DC output determined experimentally by Hung Quang Nguyen in *Experimental and Theoretical Studies of Tunneling Phenomena Using Scanning Tunneling Microscopy and Spectroscopy*, Ph. D. Thesis, available from University Microfilms International (now called Bell and Howell Information and Learning) (1989). In FIG. 7a, the DC output over a Scanning Tunneling Microscope (STM) junction was measured as the spacing between the tip and the anode was held constant and the diode was irradiated with lasers of various frequencies. In FIG. 7b, the frequency of the incident radiation was held constant as the tip-anode spacing was varied. The graph of FIG. 7a shows that the measured DC output decays as the frequency v of the incident radiation rises and the tip-anode spacing S is held constant. The graph of FIG. 7b shows that the measured DC output decays as the tip-anode spacing S rises and the frequency v of the incident radiation is held constant. FIGS. 7a and 7b show that electrons in the tip (charged by the incident radiation) cannot penetrate the barrier of the STM junction if the tunneling junction is too long or if the electric field oscillates too quickly.

SUMMARY OF THE INVENTION

Rectification in the visible spectrum may be achievable in principle provided the spacing between the two electrodes is sufficiently small, so that electrons can transit through the device before the bias produced by incident radiation reverses.

An exemplary photovoltaic device of the present invention uses a "single element rectenna" made from metallic carbon nanotubes (mCNTs) or nanowires. This single element acts as both a receiving antenna and a rectifying diode. This solar cell consist of at least one nanowire/mCNT, situated in arrays on planar substrates, with each element acting as a point-contact diode. The nanowire/mCNTs terminate in a metal-vacuum-metal (MVM) or metal-insulator-metal (MIM) barrier where charge is transported through the barrier via tunneling. The problem of low frequency response of standard planar MIM diodes (limited by parasitic capacitance effects) is intended to be overcome by the use of the point-contact nanowire/mCNT devices. The configuration of the nanowire/mCNT apices and the planar base electrodes can provide rectification, since the asymmetrical geometry (in the MVM or MIM junction), induces asymmetric tunneling barriers that provide asymmetric forward and reverse tunneling currents.

By this device, method, and system, incident radiation of greater density or energy content than is obtainable by standard solar cells can be captured and converted into useful electrical energy by using the exemplary embodiments and exemplary methods of the present invention.

An exemplary embodiment of the present invention is a device for receiving and converting incident radiation into DC current, including a transparent conductor, at least one point-contact diode, the at least one point-contact diode having a nanowire/mCNT providing a receiving antenna function and a rectification function, a thin insulating layer, situated between the transparent conductor and the nanowire/mCNT, and a point-contact junction, at which the nanowire/mCNT contacts the thin insulating layer.

In a further exemplary embodiment of the present invention, the nanowire/mCNT includes a sharp edge.

In further exemplary embodiments of the present invention, the sharp edge of the nanowire/mCNT is a point, a line, or a circle.

In a further exemplary embodiment of the present invention, the point-contact junction includes a small contact area, which may be on the order of about 50 to 200 square nanometers.

In a further exemplary embodiment, the nanowire/mCNT and the transparent conductor may be in close proximity, on the order of about 0 to 10 nanometers.

In further exemplary embodiments of the present invention, the nanowire may include a metallic tip or a metallic whisker.

In a further exemplary embodiment of the present invention, the nanowire/mCNT may be made of a metal having a high absorption of radiation, on the order of about at least 1% to about at least 10%. The metal may have a low reflectivity of radiation, a high conductivity, or a low resistivity, and may include metals such as—but not limited to—tungsten, molybdenum, nickel, gold or silver.

In a further exemplary embodiment of the present invention, the length of the nanowire/mCNT is on the order of about ¼ of the wavelength of the incident radiation. In a further exemplary embodiment, the length of the nanowire/mCNT is on the order of about 1 to 10 times the wavelength of the incident radiation.

In a further exemplary embodiment of the present invention, each nanowire/mCNT is separated from other nanowires/mCNTs by a distance that is on the order of about one, two or three times the wavelength of the incident radiation.

In a further exemplary embodiment of the present invention, an external load is provided for receiving and storing DC current.

DETAILED DESCRIPTION

In the solar cell apparatus and system of the present invention, the problem of the low frequency response of the planar MIM diodes is intended to be overcome by using the individual constituents of a vertical array of aligned metallic carbon nanotubes (mCNTs) and/or nanowires (which may be metallic tips or whiskers), where each one acts as a combined antenna and rectifier in a point-contact configuration. With the present system, point-contact devices (which have been used in measurements of absolute frequencies of lasers up to the green part of the visible spectrum and which demonstrate a response time of the order of femtoseconds that is significantly faster than standard MIM diodes, and which are not believed to have been previously used in solar cells) are used in the exemplary embodiments of the present invention, as described herein.

Figure 1:
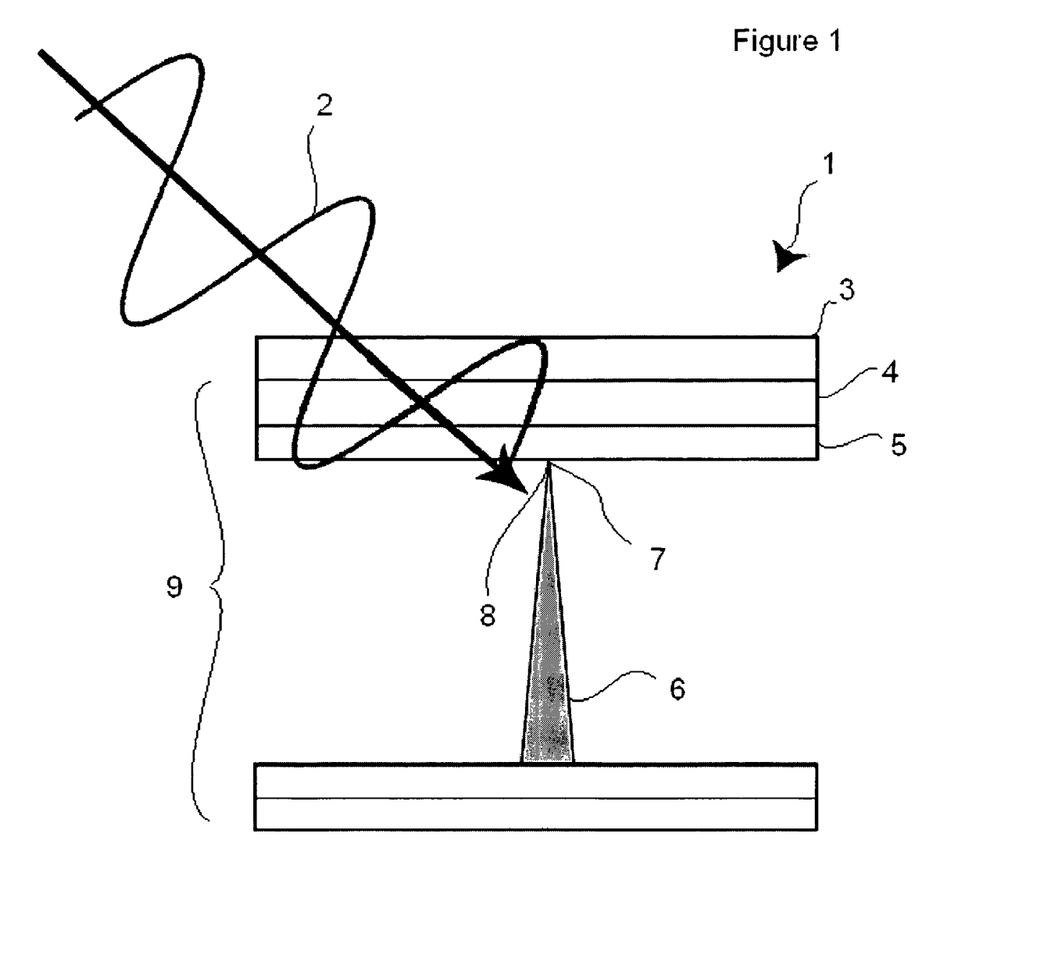
FIG. 1 shows an exemplary embodiment of the solar cell of the present invention, where only one nanowire/mCNT is shown so as to simplify the view.

As shown in FIG. 1, the solar cell 1 receives incident solar radiation 2 through a transparent cover layer 3. The transparent cover layer is situated over at least one nanowire/mCNT-based high-frequency diode 9. The nanowire/mCNT-based high-frequency diodes 9 include nanowire/mCNT rectifying antennas 6 (instead of a planar MIM or MVM diode device). A nanowire/mCNT is in close proximity (on the order of about 0-10 nanometers) with a metal electrode 4 on one side to form a rectifying contact 7. The metal electrode layer 4 includes a transparent conductive layer, which may be made of indium-tin-oxide or any suitable transparent conductor. A thin insulating layer 5 lies between the metal electrode layer 4 and the nanowire/mCNT 6 and may be made up of any suitably appropriate electrically insulating layer, including a vacuum layer. The end of the nanowire/mCNT 6 at the contact area 7 is the sharp edge 8 of the nanowire/mCNT 6, and forms a point-contact junction 7 with the insulating layer 5.

In another exemplary embodiment, the sharp edge 8 may be a needle-like tip. In still another exemplary embodiment, the sharp edge 8 may be a razor-like edge. In yet another exemplary embodiment, the sharp edge 8 may be a circle like the upper edge of a cylinder.

The distance between adjacent nanowire/mCNTs 6 may be on the order of about 2 or 3 times the width of the incident solar wavelength, which for practical purposes is about 300-2000 nanometers, but it is believed that the separation distance should be no more than on the order of about a few hundred nanometers to insure a viable collection efficiency.

Figure 2:
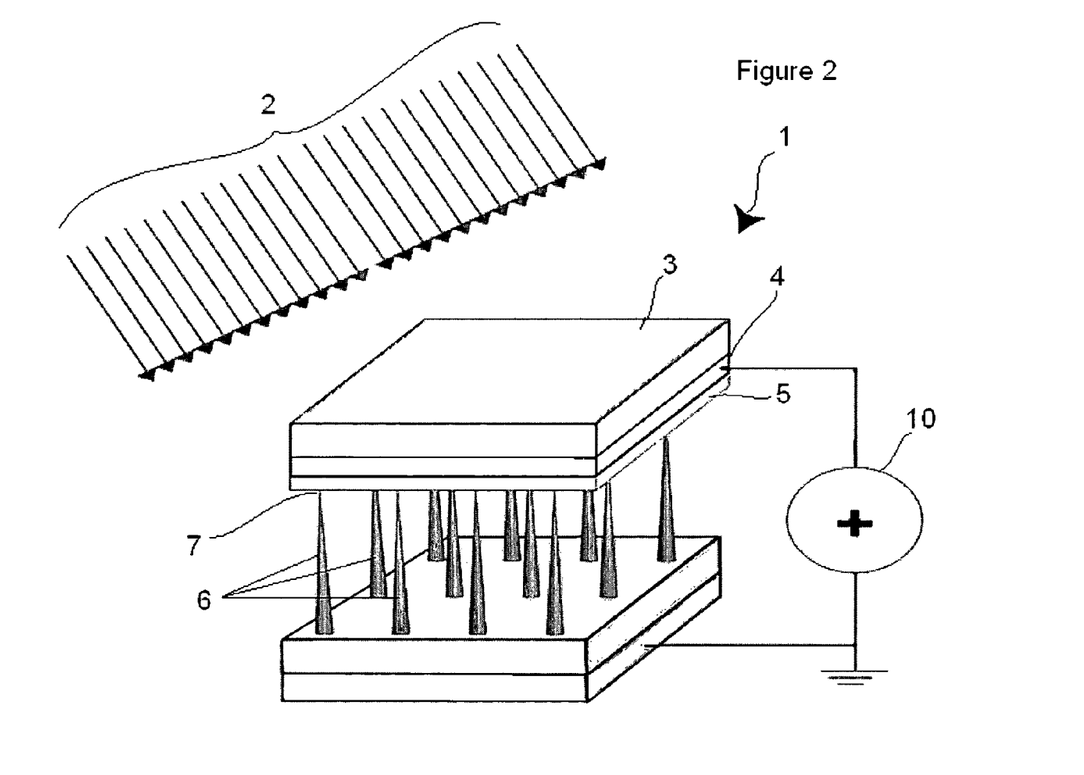
FIG. 2 shows an exemplary embodiment of the solar cell of the present invention, together with a plurality of nanowire/mCNTs and an external load.

In FIGS. 1 and 2, as photons from incident solar radiation 2 reach the nanowire/mCNT 6, it absorbs the photons. In the infrared and optical regions, where the length of the point-contact nanowire/mCNT 6 is several wavelengths larger (on the order of about 1-10 wavelengths larger) than the incident radiation 2, the nanowire/mCNT 6 will act as an efficient antenna when the nanowire is equal to an appropriate length, such as a quarter of the wavelength of the incident radiation.

FIG. 2 shows the solar cell device 1 of the present invention as having a plurality of nanowire/mCNTs 6. In addition, FIG. 2 further shows an external load 10 connected to the solar cell 1 for utilizing and/or storing rectified DC current.

Appropriate selection of the diode antenna length, electrical conductivity, optical reflectivity and load impedance may be used to improve the receiving properties of the solar cell diode 9, and to optimize the power absorption, and therefore the intensity of the current emission, or correspondingly, the output power in a rectenna solar cell 1. In the exemplary embodiment, a length of the nanowire 6 is ¼ of the wavelength of the incident radiation 2.

The energy absorbed by the nanowire/mCNT 6 causes electronic charge carriers to move to the sharp edge 8 of the nanowire/mCNT 6, and this charge sets up an AC voltage in the nanowire/mCNT 6. As explained below, the geometric asymmetry of the point-contact junction 7 causes a rectification of the AC current passing through the tunneling junction 7. Once the current has been rectified, the transparent conductive layer 4 collects the rectified DC current. From this transparent conductive layer 4 (or anode), the DC current is coupled to an external load 10 to use and/or store the usable energy. In this manner, the metallic nanowire/mCNT acts as a receiving antenna to absorb the solar radiation, generating an alternating voltage in the nanowire/mCNT, which is then rectified in the point-contact junction 7 to create a DC voltage on the transparent conductive layer 4.

Nanowire/mCNT-based tunneling diodes have been shown to have an extremely high frequency response (see Hung Quang Nguyen, *Experimental and Theoretical Studies of Tunneling Phenomena Using Scanning Tunneling Microscopy and Spectroscopy*, Ph. D. Thesis, available from University Microfilms International (now called Bell and Howell Information and Learning) (1989)). This high frequency response is believed to be superior as compared to the lower frequency response of standard planar MIM diodes. Accordingly, these types have been adapted for use in the present solar cell device of the present invention.

Unlike standard solar cells (or rectennas), the rectification process may be due solely or primarily to the geometrical asymmetry of the sharp CNT/nanowire edge 8. The rectification process can also be enhanced by material and temperature asymmetries, as discussed by A. Mayer, M. S. Chung, B. L. Weiss, N. M. Miskovsky, and Paul H. Cutler in *Three-Dimensional Analysis of the Geometrical Rectifying Properties of Metal-Vacuum-Metal Junctions and Extension for Energy Conversion*, Phys. Rev. B. 77, 085411 (Feb. 8, 2008), which is incorporated by reference.

A factor in the efficiency of the nanowire/mCNT-based solar cell 1 is the ability to produce an induced current from the nanowire/mCNT 6 by minimizing the parasitic capacitance. This may be achieved through the point-contact junction 7, which causes a rectification of the AC current passing through the tunneling junction 7. When the nanowire/mCNT contact area is very small, on the order of about 50-200 nm$^2$, the frequency response in the optical frequency region is improved relative to a planar MIM diode by two orders of magnitude, so that the device is able to convert the absorbed electromagnetic wave from the incident solar radiation 2 into DC current.

In the article by Krzysztof Kempa, Jakub Rybczynski, Zhongping Huang, Keith Gregorczyk, Andy Vidan, Brian Kimball, Joel Carlson, Glynda Benham, Yang Wang, Andrzej Herczynski, and Zhifeng Ren, *Carbon Nanotubes as Optical Antennae*, Adv. Mater. 19, 421-426 (2007), multi-walled CNTs having radii on the order of about 1-20 nanometers and having lengths on the order of about 1-10 microns are shown to have the properties of optical antennas.

In the paper by A. Mayer, M. S. Chung, B. L. Weiss, N. M. Miskovsky, and P. H. Cutler, *Three-Dimensional Analysis of the Geometrical Rectifying Properties of Metal-Vacuum-Metal Junctions and Extension for Energy Conversion*, Phys. Rev. B. 77, 085411 (Feb. 8, 2008), which is incorporated by reference, it was predicted that similarly sized nanowires exhibit antenna and rectifier properties in the optical region.

Figure 4A:
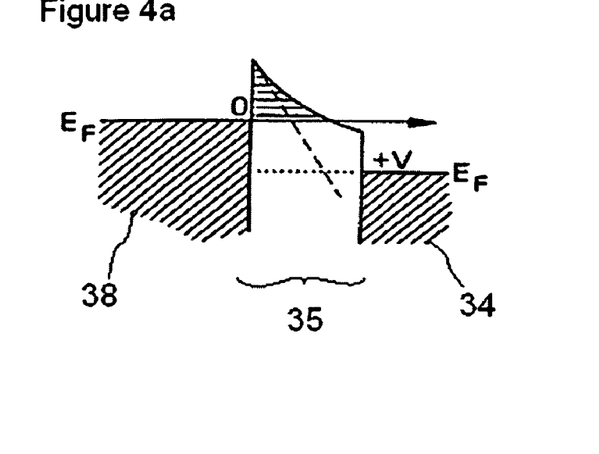
FIG. 4a shows a representation of the tunneling junction of an exemplary embodiment of the present invention under forward bias.
Figure 4B:
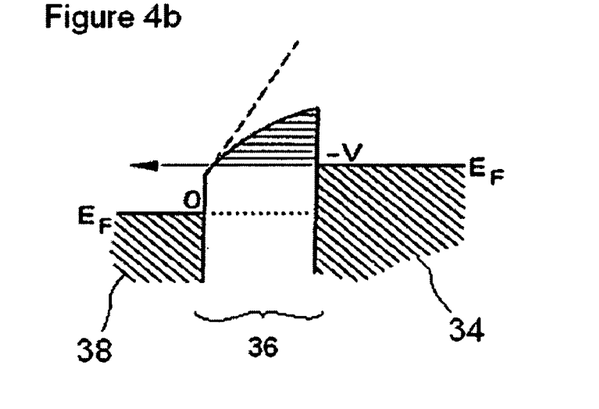
FIG. 4b shows a representation of the tunneling junction of an exemplary embodiment of the present invention under reverse bias.
Figure 4C:
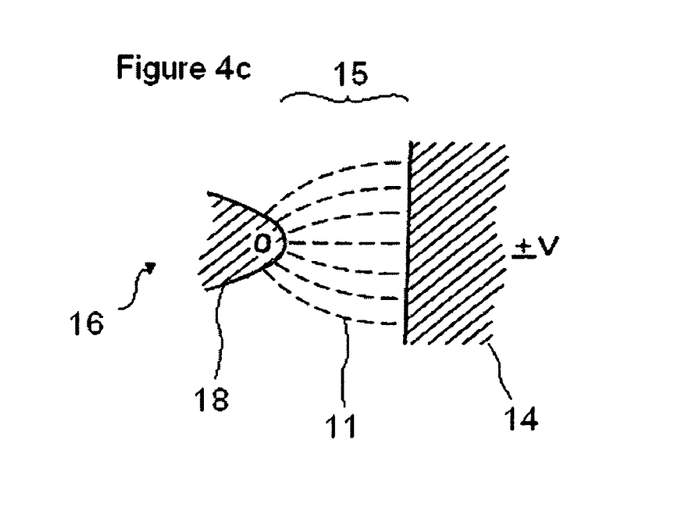
FIG. 4c shows a point-contact junction of the exemplary embodiment of the present invention, including the electric field lines.

FIG. 4c shows the point-contact junction, having a thin insulating/vacuum layer 15 situated between the nanowire/mCNT 16 (having sharp edge 18) and a metal electrode 14. The dashed lines 11 represent the electric field in the point-contact junction. This structure allows the propagation of incident radiation-induced surface currents along the length of the nanowire/mCNT 6 with small attenuation. A surface charge accumulates at the edge 18, induced by the absorbed solar radiation. This charge distribution sets up an AC bias voltage between the edge 18 and the metal electrode layer 14 (that is, the anode or transparent conductive layer).

Figure 3:
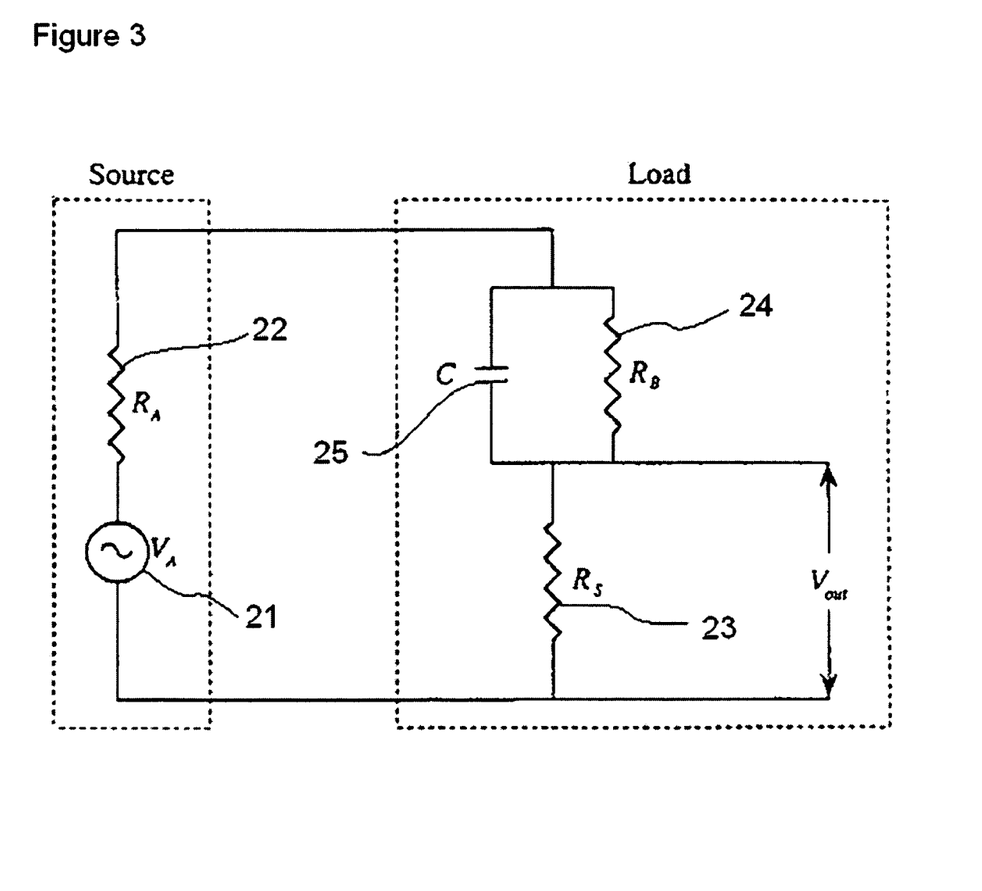
FIG. 3 shows a "circuit equivalent" of the solar cell diode of the present invention.

FIG. 3 shows the lump circuit receiving properties of the nanowire/mCNT point-contact device 6, represented as an AC voltage source 21 having a voltage $V_A$ connected in series with an antenna resistance 22 having a resistance $R_A$. The lumped-parameter circuit for a point-contact diode junction 7 may be described in terms of a spreading-edge resistance 23 having a resistance $R_S$ in series with a parallel combination of the nonlinear resistor 24 having a resistance $R_B$ and a nonlinear capacitor 25 having a capacitance C which represents the junction barrier. In the point-contact diode used in high frequency mixing experiments, the contribution of the resistance $R_S$ to the overall nonlinearity of the diode is small, and is mostly due to the resistance $R_B$. Since the resistance $R_S$ essentially arises from the electron-phonon scattering process which occurs in the bulk material, it should not strongly depend on the detailed nature of the contact. However, for the point-contact diodes 9 with small contact resistance $R_B$, the overall non-linearity of the diode can be dominated by the edge resistance $R_S$.

The RC high frequency cutoff of the point-contact diode 9 is proportional to $(C^2 R_S R_B)^{-1/2}$. Since the junction barrier capacitance C is proportional to the contact area A, the junction barrier resistance $R_B$ is proportional to $A^{-1}$ and the edge resistance $R_S$ is inversely proportional to the contact radius, and the cutoff frequency is proportional to $A^{-1/4}$. By making the contact area as small as possible (on the order of about 50-200 nm$^2$), and using a low resistivity metal, such as—but not limited to—tungsten, molybdenum, nickel, gold or silver, for the edge 8, a point-contact diode rectifier is obtained with a response time in the optical region, corresponding to frequencies on the order of about 100-1000 THz.

Rectification in a nanowire/mCNT point contact diode 9 may result from the geometric asymmetry of the diode structure or from the dissimilar materials. This geometric asymmetry is shown in FIGS. 4a and 4b, where, for an applied electric bias, the currents in the forward and reverse direction (even for identical metals) are not equal because geometrically induced asymmetric tunneling barriers lead to asymmetric forward and reverse tunneling currents. As shown in FIGS. 4a and 4b, for the forward bias, the concave potential barrier 35 is not symmetrical with the reverse bias convex potential barrier 36 between the edge 38 and the base 34. This rectification may be further enhanced by providing material asymmetry, of the edge 38 and base 34, and by changing other physical parameters of the junction, such as the edge radius and the edge-base (anode) spacing. This is experimentally confirmed by measuring the I-V characteristics of an STM, which is just a point-contact diode with atomic scale control of the vacuum spacing in the junction.

Figure 5:
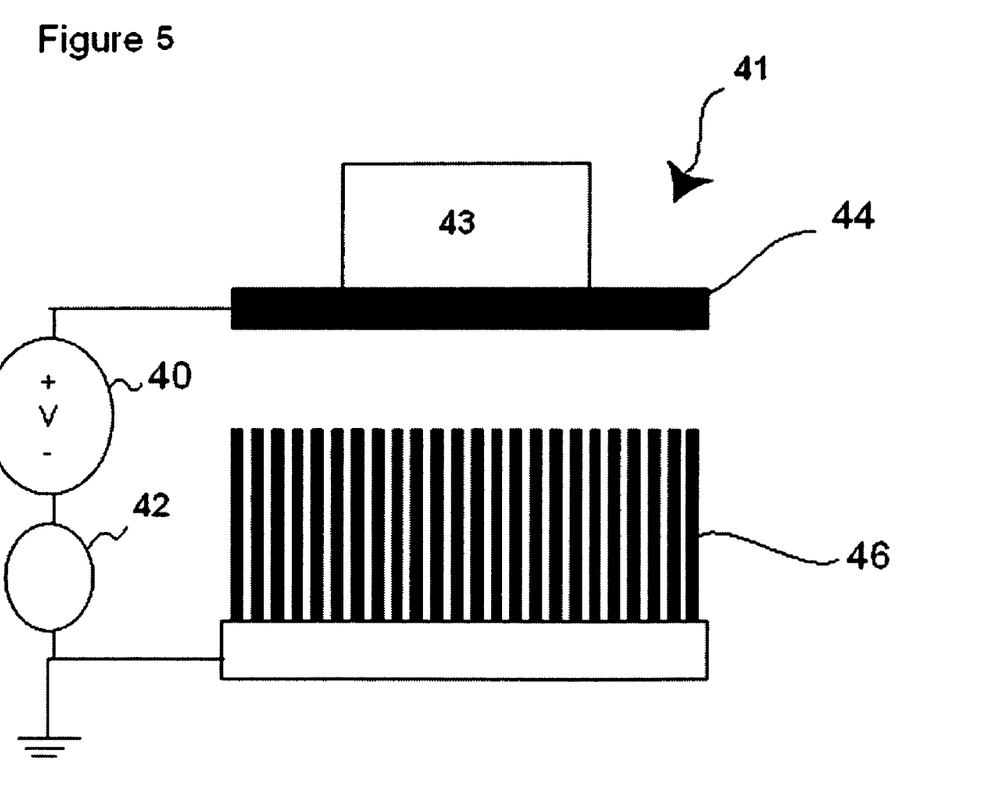
FIG. 5 shows a schematic of a test set-up for testing a solar cell device of the exemplary embodiment of the present invention.

FIG. 5 shows a schematic of a test set-up 41, for testing the nanowire/mCNT solar cells of the exemplary embodiment. This test set-up allows the metal electrode 44 to be positioned by the piezo-positioner 43 in close proximity (on the order of about 1-10 nm) with the nanowire/mCNT array 46. This test set-up may then be irradiated with lasers or simulated solar radiation. The I-V (current-voltage) characteristics are measured by voltage source 40 and electrometer or low current ammeter 42 with and without simulated solar radiation. Irradiation with lasers provides information on the nanowire/mCNT solar cell device's response to monochromatic light, in addition to its frequency response limits, whereas irradiation with a solar simulator indicates the device's response as a photovoltaic device. The test set-up is not intended to limit or define the exemplary embodiment of the present invention, but merely to show a manner of testing the exemplary embodiment.

Figure 6A:
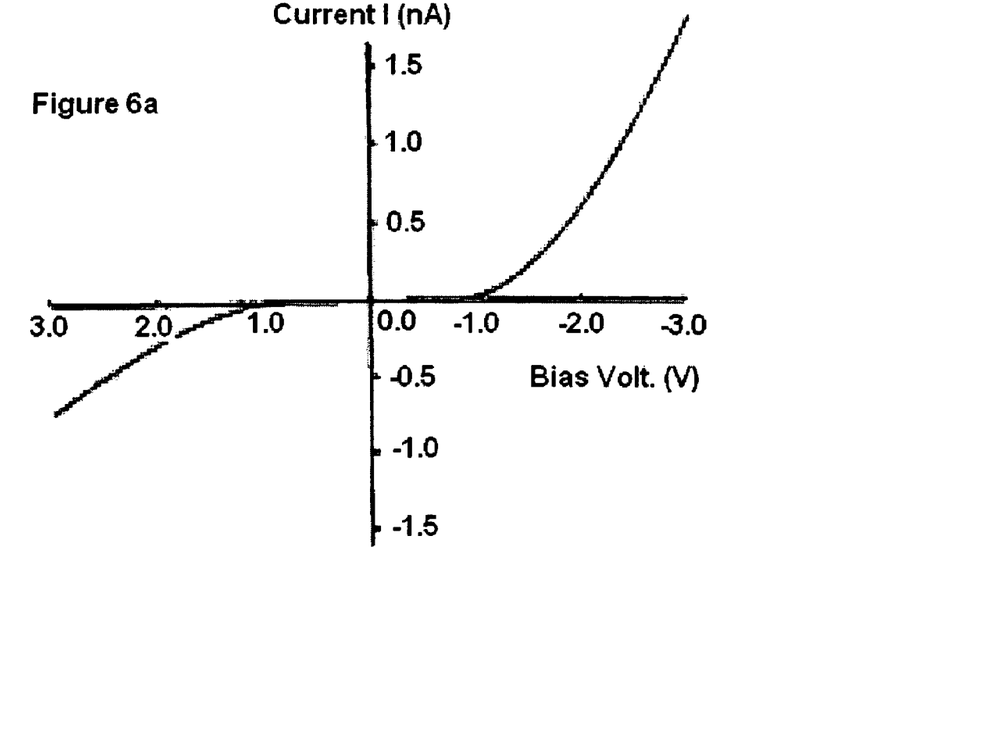
FIGS. 6a, 6b and 6c show experimental results in three graphs of the measurement of I-V characteristics of STM junctions (as discussed in Hung Quang Nguyen, *Experimental and Theoretical Studies of Tunneling Phenomena Using Scanning Tunneling Microscopy and Spectroscopy*, Ph. D. Thesis, available from University Microfilms International, now called Bell and Howell Information and Learning (1989)).
Figure 6B:
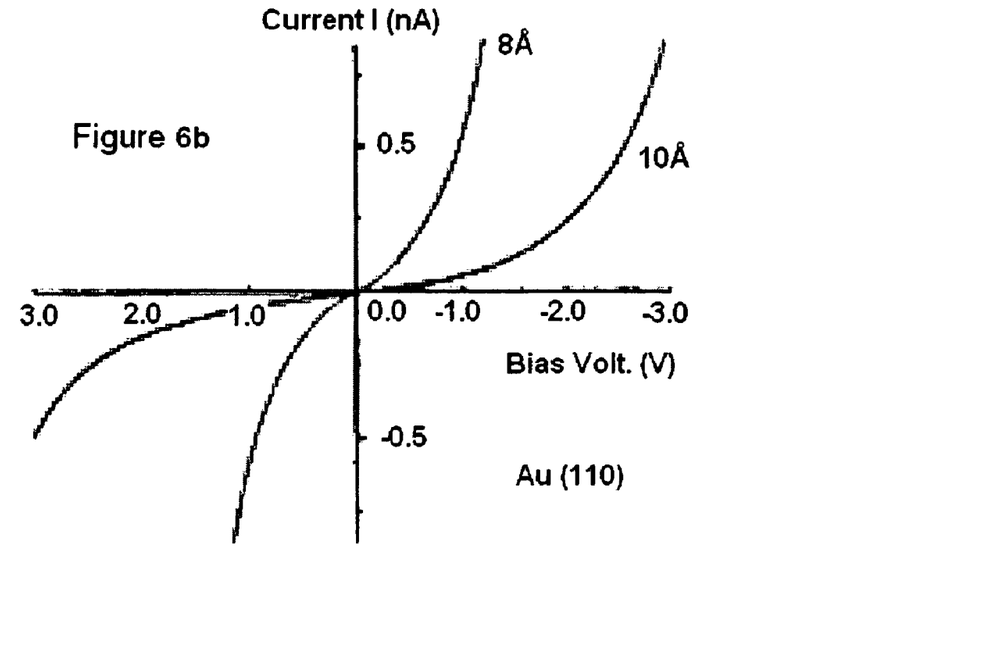
Figure 6C:
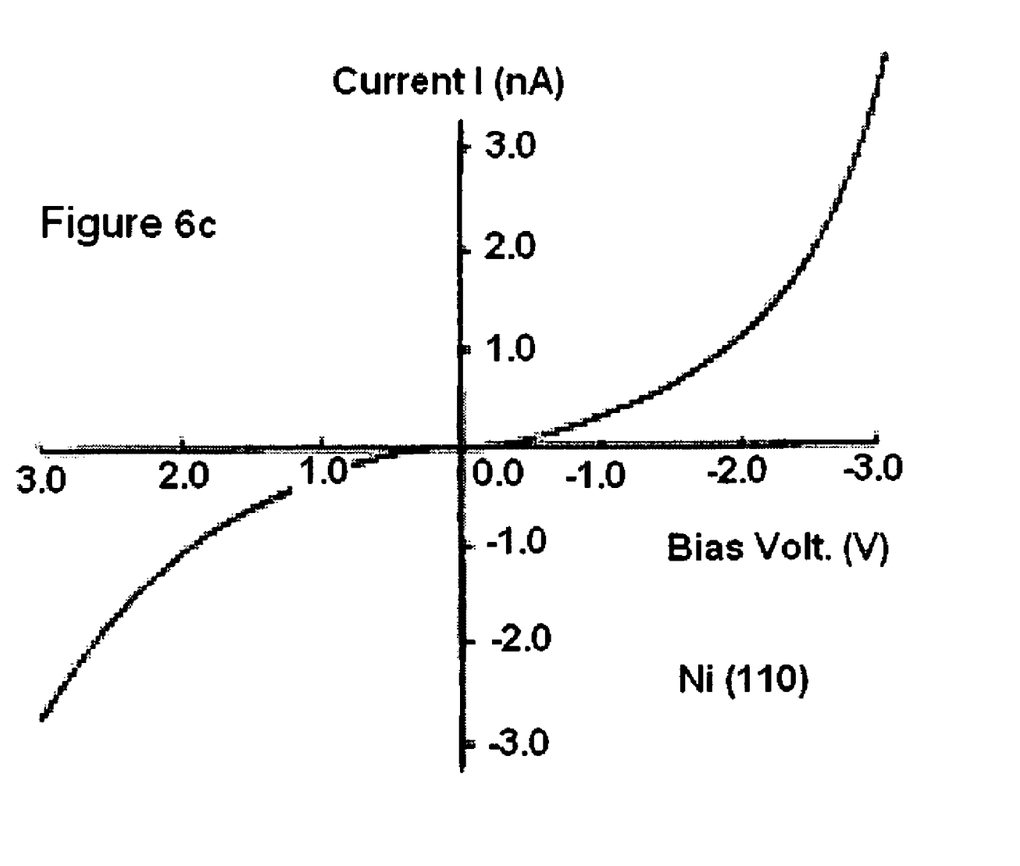

FIGS. 6a, 6b and 6c show the experimental results of rectification for different materials and tip anode separations, as discussed by Hung Quang Nguyen in *Experimental and Theoretical Studies of Tunneling Phenomena Using Scanning Tunneling Microscopy and Spectroscopy*, Ph. D. Thesis, available from University Microfilms International (now called Bell and Howell Information and Learning) (1989), and by H. Q. Nguyen, Paul H. Cutler, T. E. Feuchtwang, Zhi-Hong Hunag, Young Kuk, P. J. Silverman, A. A. Lucas and T. E. Sullivan in *Mechanisms of Current Rectification in an STM Tunnel Junction and the Measurement of an Operational Tunneling Time*, IEEE Trans. on Electron Devices, 36, pp. 2671-2678, (1989), which is incorporated by reference.

In particular, FIGS. 6a, 6b and 6c show the I-V characteristics of W—Si (FIG. 6a), W—Au (110) (FIG. 6b), and W—Ni (110) (FIG. 6c) STM junctions which exhibit the highly nonlinear behavior and current asymmetry about the zero bias point. In FIGS. 6a, 6b and 6c, the tip radius and tip-anode separation are about 1 nanometer. For the W—Au (110) junction, the separation "s" equals 0.8 nanometer. The current flowing to the anode is larger when the edge is negatively biased relative to the anode (as in FIG. 4a having forward bias), than when it is reverse biased (as in FIG. 4b). The nonlinearity can originate primarily from any or all of the following three properties of the junction, namely its material, its geometrical and its thermal asymmetry. For identical materials (at the same temperature), however, it is essentially only the geometrical asymmetry of the edge-anode structure.

A formalism to assess the feasibility of the present devices for solar energy conversion may be defined as follows:

$$\eta = P_{out}/P_{in},$$

where $P_{out}$ is the DC output power and $P_{in}$ is the power incident on the device assuming a solar intensity of 1000 W/m$^2$ (0.1 W/cm$^2$).

This quantity is frequency dependent for all solar conversion devices including photovoltaics and rectennas. For photovoltaics, the DC power output is material dependent (e.g., bandgap and resistivity). In contrast, in the rectenna devices of the exemplary embodiment, the efficiency depends on both the controllable geometry and on the material parameters (e.g., electrical and optical constants), with no bandgap (or essentially none as a practical matter) dependence for metallic nanowire antennas. Distinct advantages of the nanowire/mCNT rectenna are the demonstrated fast response (up to the green part of the spectrum) and low resistivity, which reduces the ohmic heat losses in the system. Point-contact metallic nanowire/mCNTs for use in photovoltaic devices provide increased efficiencies.

The theoretical efficiency "η" requires the determination of output DC power. This can be determined in the solar spectrum range of frequencies using the model by T. E. Sullivan in *Thermal and Field Emission Effects of Laser Radiation on Meal Whisker Diodes: Application to Infrared Detection Devices*, Ph.D. Thesis, University Microfilms International (now called Bell and Howell Information and Learning) (1977), and, more exactly, using the quantum mechanical formalism by A. Mayer, M. S. Chung, B. L. Weiss, N. M. Miskovsky, and Paul H. Cutler in *Three-Dimensional Analysis of the Geometrical Rectifying Properties of Metal-Vacuum-Metal Junctions and Extension for Energy Conversion*, Phys. Rev. B. 77, 085411 (Feb. 8, 2008), which is incorporated by reference.

A model calculation for the efficiency of a nanowire/mCNT rectenna irradiated with the equivalent of solar radiation is now described. The output power is given by: $P_{out}=JA_e V$, where J is the field emitted current density, $A_s$ is the emitting area, and V is the DC rectified voltage developed between the edge and anode. The effective input power to the rectenna for the solar intensity is given by: $P_{in}=I_s A_b$, where $I_s$ is the solar intensity of 0.1 W/cm$^2$ and $A_b$ is the area of the beam intercepted by the nanowire/mCNT, as follows:

$$\eta = P_{out}/P_{in} = JVA_e/(I_s A_b).$$

The Fowler-Nordheim equation is used to estimate these quantities, as follows:

$$J = 1.54 \times 10^{-6} F^2/\phi \operatorname{Exp}(-6.83 \times 10^7 \phi^{3/2}/F).$$

Here, F is the local field at the tip edge in V/cm and φ is the work function in eV, with J having units of A/cm$^2$. The field values may be obtained from the thesis of T. E. Sullivan, *Thermal and Field Emission Effects of Laser Radiation on Meal Whisker Diodes: Application to Infrared Detection Devices*, Ph.D. Thesis, University Microfilms International (now called Bell and Howell Information and Learning) (1977).

The corresponding values of V and F may be obtained from FIG. 15 of the 1977 Sullivan thesis. The area of the emitting tip edge is estimated from a standard model calculation for field emitters, where $I_s$ is the solar irradiance equal to 0.1 W/cm$^2$ and $A_b$ is approximately one-half the cylindrical surface area of the rectenna. The efficiency is determined assuming the local electric fields at the tip edge, $F=1-5\times10^7$V/cm, which may be obtained from the 1977 Sullivan thesis. With F being determined, V is known. For a point-like edge of radius of 2 nanometer and field values consistent with the 1977 Sullivan thesis (~3–5×10$^7$V/cm), the efficiencies of the diode are comparable to or exceed the efficiencies of competitive technologies.

These values may be lower if certain losses, such as Joule heating and scattering effects of the incident radiation, are taken into account, but these values are small compared to the calculated efficiencies, as discussed by A. Mayer, M. S. Chung, B. L. Weiss, N. M. Miskovsky, and Paul H. Cutler in *Three-Dimensional Analysis of the Geometrical Rectifying Properties of Metal-Vacuum-Metal Junctions and Extension*

*for Energy Conversion*, Phys. Rev. B. 77, 085411 (Feb. 8, 2008), which is incorporated by reference.

It may be seen that the predicted efficiencies equal or exceed efficiencies of competitive technologies. Thus, the efficiency may be controlled by an appropriate selection of material (based on, for example, the work function φ) and geometric parameters of the edge. Although these calculations are based on radiation in the IR region of the solar spectrum (i.e., λ~1 µm), a more precise calculation may involve extending the wavelength into the visible region of the solar spectrum. In the latter case, the emission process can be enhanced by photoemission and thermal effects.

What is claimed is:

1. A device for receiving and converting incident radiation into DC current, comprising:
   a transparent conductor;
   at least one point-contact diode, the at least one point-contact diode having a nanowire providing a receiving antenna function and a rectification function, the nanowire including a sharp edge, the nanowire tapering and being narrowest at the sharp edge;
   a thin insulating layer, situated between the transparent conductor and the nanowire; and
   a point-contact junction, at which the sharp edge of the nanowire contacts the thin insulating layer.

2. The device of claim 1, wherein the sharp edge is a point.

3. The device of claim 1, wherein the sharp edge is a line.

4. The device of claim 1, wherein the sharp edge is a circle.

5. The device of claim 1, wherein the point-contact junction includes a small contact area.

6. The device of claim 1, wherein the point-contact junction includes a small contact area on the order of about 50 nm² to 200 nm².

7. The device of claim 1, wherein the nanowire is in close proximity to the transparent conductor.

8. The device of claim 1, wherein the nanowire is separated from the transparent conductor by a distance on the order of about 0 nm to 10 nm.

9. The device of claim 1, wherein the nanowire includes one of a metallic tip and a metallic whisker.

10. The device of claim 1, wherein the nanowire is made of a metal having a high absorption of radiation.

11. The device of claim 1, wherein the nanowire is made of metal having a characteristic absorption rate on the order of at least about 1%.

12. The device of claim 1, wherein the nanowire is made of metal having a characteristic absorption rate on the order of at least about 10%.

13. The device of claim 1, wherein the nanowire is made of a metal having a low reflectivity of radiation.

14. The device of claim 1, wherein the nanowire is made of a metal having a high conductivity.

15. The device of claim 1, wherein the nanowire is made of a metal having a low resistivity.

16. The device of claim 15, wherein the metal having low resistivity includes tungsten.

17. The device of claim 15, wherein the metal having low resistivity includes molybdenum.

18. The device of claim 15, wherein the metal having low resistivity includes nickel.

19. The device of claim 15, wherein the metal having low resistivity includes gold.

20. The device of claim 15, wherein the metal having low resistivity includes silver.

21. The device of claim 1, wherein the length of the nanowire is about ¼ of the wavelength of the incident radiation.

22. The device of claim 1, wherein the length of the nanowire is about 1 to 10 times the wavelength of the incident radiation.

23. The device of claim 1, wherein the nanowire is separated from adjacent nanowires by a distance that is on the order of about a wavelength of the incident radiation.

24. The device of claim 1, wherein the nanowire is separated from adjacent nanowires by a distance that is on the order of about twice the wavelength of the incident radiation.

25. The device of claim 1, wherein the nanowire is separated from adjacent nanowires by a distance that is on the order of about three times the wavelength of the incident radiation.

26. The device of claim 1, wherein the thin insulating layer is a vacuum.

27. The device of claim 1, further comprising: an external load for receiving and storing the DC current.

28. The device of claim 1, wherein the at least one point-contact diode includes a plurality of point-contact diodes, each of the plurality of point-contact diodes having a nanowire providing a receiving antenna function and a rectification function, each of the nanowires including a sharp edge, and wherein each of the nanowires tapers and is narrowest at the sharp edge.

29. The device of claim 28, wherein each of the nanowires is conical, and wherein the sharp edge of each of the nanowires is an apex thereof.

30. A device for receiving and converting incident radiation into DC current, comprising:
   a transparent conductor;
   at least one point-contact diode, the at least one point-contact diode having a metallic carbon nanotube providing a receiving antenna function and a rectification function, the metallic carbon nanotube including a sharp edge, the metallic carbon nanotube tapering and being narrowest at the sharp edge;
   a thin insulating layer, situated between the transparent conductor and the metallic carbon nanotube; and
   a point-contact junction, at which the sharp edge of the metallic carbon nanotube contacts the thin insulating layer.

* * * * *